United States Patent [19]

Bichler

[11] Patent Number: 4,625,181
[45] Date of Patent: Nov. 25, 1986

[54] INTEGRATED SEMICONDUCTOR CIRCUIT WITH A RING OSCILLATOR

[75] Inventor: Helmut Bichler, Gräfelfing, Fed. Rep. of Germany

[73] Assignee: Siemens Aktiengesellschaft, Berlin and Munich, Fed. Rep. of Germany

[21] Appl. No.: 692,369

[22] Filed: Jan. 17, 1985

[30] Foreign Application Priority Data

Jan. 18, 1984 [DE] Fed. Rep. of Germany ....... 3401610

[51] Int. Cl.⁴ .............................................. H03B 5/02
[52] U.S. Cl. .................................. 331/57; 331/177 R
[58] Field of Search ................. 331/57, 108 B, 108 C, 331/108 D, 135, 177 R; 307/303

[56] References Cited

U.S. PATENT DOCUMENTS 4,079,338 3/1978 Kronlage .............................. 331/57

Primary Examiner—Gene Wan
Attorney, Agent, or Firm—Herbert L. Lerner; Laurence A. Greenberg

[57] ABSTRACT

An integrated semiconductor circuit with a ring oscillator having a frequency settable via an operating current of the ring oscillator, the ring oscillator having inverter cells which are connected in parallel with respect to the current supply of the ring oscillator, conjointly with a current supply terminal thereof, via a variable resistance to the supply potential present in the current supply, includes a voltage divider forming the variable resistance and including a plurality of series-connected resistors, the voltage divider having a plurality of terminals including an end terminal, the end terminal connecting the voltage divider in an identical manner to a current supply terminal of the inverter cells of the ring oscillator and, additionally, to an externally addressable electrode, each even-numbered other terminal of the voltage divider, as counted in direction of increasing distance from the end terminal, being likewise connected to another externally addressable electrode, respectively, of the integrated circuit and additionally connected via a respective diode to both terminals, respectively, adjacent thereto, the connecting diodes having respective anodes connected to respective uneven-numbered terminals, and having respective cathodes connected to a respective one of the two even-numbered terminals adjacent thereto.

7 Claims, 3 Drawing Figures

INTEGRATED SEMICONDUCTOR CIRCUIT WITH A RING OSCILLATOR

SPECIFICATION

The invention relates to an integrated semiconductor circuit with a ring oscillator, the frequency of which can be set via an operating current of the ring oscillator by connecting inverter cells of the ring oscillator, which are connected in parallel with respect to the current supply of the ring oscillator, conjointly with a current supply terminal thereof via a variable resistor to the supply potential present in the current supply. The invention is thus concerned, in particular, with a ring oscillator constructed in accordance with I²L technology.

BACKGROUND OF THE INVENTION

It has become known heretofore that, in I²L ring oscillators and also in other ring oscillators realized by bipolar technology, the frequency delivered by the oscillator depends upon the magnitude of the operating current. By adjusting the total operating current of the oscillator and, thereby, of the supply current of the individual, mutually alike cells of the ring oscillator, the oscillator frequency can be influenced. Use is made of this fact, for example, in the integrated semiconductor circuits with I²L ring oscillators described in U.S. Pat. No. 4,079,338. It is desirable so to develop the circuit that it operates reliably with respect to frequency accuracy or exactness and to temperature stability of the frequency. This can be achieved, for example, by including quartz or ceramic oscillators in the circuit. If one wished to adjust the oscillator on the integrated module, however, the only possibility which was available heretofore is disclosed in detail in FIG. 1 of the drawing herein. While this possibility avoids external wiring, it requires a relatively large area for the trimming circuit in the semiconductor chip containing the integrated circuit.

SUMMARY OF THE INVENTION

It is accordingly an object of the invention to provide an integrated circuit with a ring oscillator circuit which is much improved with respect to the area required for the trimming circuit, in the sense of reducing the area required and, in addition, reducing the influence of the temperature on the operation of the oscillator to such an extent that it can be neglected. Furthermore, it is an object of the invention to provide such a circuit which ensures a marked independence thereof from the supply voltage. With foregoing and other objects in view, there is provided, in accordance with the invention, an integrated semiconductor circuit with a ring oscillator having a frequency settable via an operating current of the ring oscillator, the ring oscillator having inverter cells which are connected in parallel with respect to the current supply of the ring oscillator, conjointly with a current supply terminal thereof, via a variable resistance to the supply potential present in the current supply, comprising a voltage divider forming the variable resistance and including a plurality of series-connected resistors, the voltage divider having a plurality of terminals including an end terminal, the end terminal connecting the voltage divider in an identical manner to a current supply terminal of the inverter cells of the ring oscillator and, additionally, to an externally addressable electrode, each even-numbered other terminal of the voltage divider, as counted in direction of increasing distance from the end terminal, being each likewise connected to another externally addressable electrode, respectively, of the integrated circuit and additionally connected via a respective diode to both terminals, respectively, adjacent thereto, the connecting diodes having respective anodes connected to a respective uneven-numbered terminal, and having respective cathodes connected to a respective one of the two even-numbered terminals adjacent thereto.

In accordance with another feature of the invention, the last even-numbered terminal ahead of the supply potential is not connected to any of the cathodes.

In accordance with a further feature of the invention, the last terminal of the voltage divider, as counted from the ring oscillator and connected to an electrode which is externally addressable but not connected to the supply potential, is connected via an end resistance formed by two series-connected fixed resistors to a supply terminal delivering the supply potential, the two series-connected fixed resistors having a divider point therebetween which is connected via a diode chain to a terminal for a reference potential, the diodes of said diode chain having respective anodes facing towards the divider point.

In accordance with an added feature of the invention, the ring oscillator is constructed in accordance with I²L technology. In accordance with an additional feature of the invention, the rest of the integrated circuit is likewise constructed in accordance with I²L technology.

In accordance with again another feature of the invention, the resistors of the voltage divider are addressable between the ring oscillator and the last electrode of the integrated circuit which is externally addressable but not connected to the supply potential, the resistors being weighted binarily with respect to the resistance values thereof.

In accordance with a concomitant feature of the invention, the supply potential is 2.5 V.

Experience with realizing the invention has shown that, if an I²L ring oscillator and the values for the supply voltage (i.e., about 2.5 V) then to be used for I²L circuits are employed, three additional electrodes and four diodes connected in the manner mentioned are sufficient, as can be seen from FIG. 2. While, on the other hand, no diodes are required in the mentioned older possibility, five externally addressed electrodes and in addition, a separable conducting connection is required instead of each of the mentioned diodes.

In the interest of suppressing the temperature influence on the oscillator frequency, it is provided in the invention in particular, that the terminal of the integrated circuit carrying the supply potential $U_s$ is connected to the voltage divider in the manner shown in FIG. 2 and, in addition, is connected to the basepoint potential of the circuit.

Finally, it is advisable to design the resistance values of the resistors forming the voltage divider differently, which obviously applies also to the possibility shown in FIG. 1. There, it is best if the resistors connected between the terminal points are given binary weighting, at most with the exception of the end resistor, connecting the last terminal point connected to one of the mentioned electrodes to supply potential. For instance, the resistor connected to the current inputs of the ring oscillator has then the highest resistance value, while the resistance value decreases with increasing distance from the ring oscillator down to the binary base value, as is the case in FIG. 1 as well as in FIG. 2.

Other features which are considered as characteristic for the invention are set forth in the appended claims.

Although the invention is illustrated and described herein as embodied in an integrated semiconductor circuit with a ring oscillator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

DESCRIPTION OF THE PREFERRED EMBODIMENT

Figure 1:
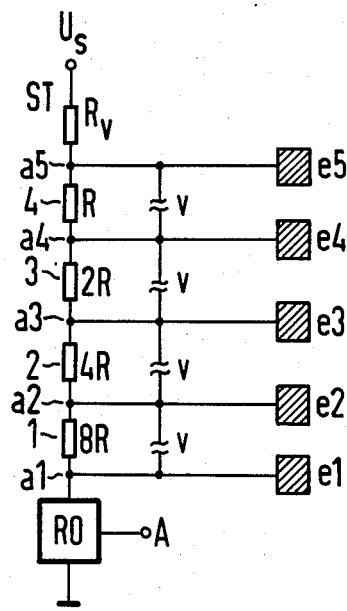
FIG. 1 is a diagram of an integrated semiconductor circuit with a ring oscillator which is in the prior art.

Referring now to the figures of the drawing, it is noted that, heretofore, only the construction of an integrated semiconductor circuit with a ring oscillator as shown in FIG. 1, has been available, except for such a circuit having an external connection with a quartz or ceramic oscillator. It has, in common with the invention of the instant application shown in FIG. 2, the use of a voltage divider as an adjustable resistor which forms a connection between current terminals of the inverter cells of the ring oscillator RO and a terminal for the supply potential $U_s$. Both the end terminal a1 tied to the ring oscillator RO as well as each of the junction points a2, a3, a4 and a5 of a voltage divider ST formed of binary-weighted resistors 1, 2, 3 and 4 and an end resistor connected to the terminal for the supply potential $U_s$ are connected via a respective line to an electrode e1, e2, e3, e4 and e5, respectively, which can be addressed externally. A separable connection v is further disposed between respective electrodes e1, e2, e3, e4 and e5 of adjacent pairs of these electrodes e1, e2, e3, e4 and e5.

It is readily apparent that, if all these cross connections v are intact, the oscillator current has its maximum value, because only the end resistor of the voltage divider ST which is connected to the supply potential terminal $U_s$ participates effectively in the limitation of the oscillator current because all other resistors are short-circuited. If then any one of the separable connections is destroyed, the resistor of the voltage divider ST shorted by this connection v is inserted into the current supply of the oscillator RO and the oscillator current is reduced depending upon the resistance value of this resistor, and thereby the oscillator frequency is decreased correspondingly. For opening the cross-connections v, which shunt the individual resistors 1 to 4 of the voltage divider ST and are constructed in a conventional manner, as fusible links or buses, the two electrodes which are associated with the respective resistor of the voltage divider and, accordingly, with the cross-connection v shunting the respective two electrodes, i.e., in the case of the resistor, the electrode $e_v$ and $e_{v+1}$, are provided. The purpose of the weighting provided for the resistors 1 to 4 is immediately evident.

Figure 2:
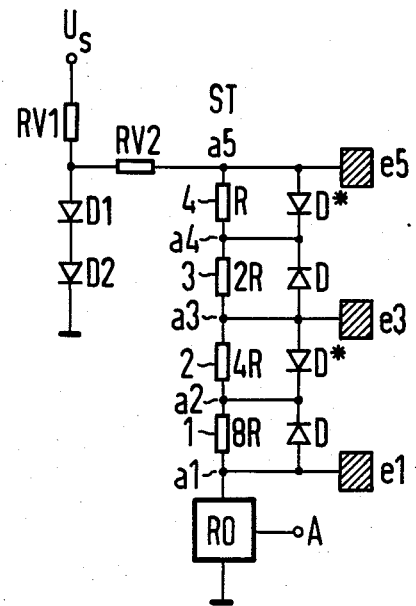
FIG. 2 is a diagram of an integrated semiconductor circuit with a ring oscillator which is constructed in accordance with the invention.

In the embodiment of the invention of the instant application shown in FIG. 2, four resistors 1 to 4 are likewise provided which, together with the connection to the supply potential $U_s$, form the voltage divider ST. However, only three externally addressed electrodes, namely, the electrodes e1, e3 and e5. which correspond to the accordingly designated electrodes in FIG. 1, are required. Accordingly, and corresponding with the definition of the invention, the electrode e1 is connected to the end terminal a1 directly connected to the ring oscillator RO and thereby, to the end resistor 1. The electrode e3 is connected electrically conductively to the junction point a3 between the resistors 2 and 3 of the voltage divider, and the electrode e5 to the junction point a5 which is located between the resistor 4 and the end resistor leading to the supply potential $U_s$. In addition, each resistor which forms part of the voltage divider and is arranged between the externally addressable electrodes e1, e3 and e5, respectively, namely the resistor 1, the resistor 2, the resistor 3 and the resistor 4, is shunted by a diode. According to the definition of the invention, each uneven-numbered resistor (with the exception, respectively, of the end resistor connected to the supply potential terminal $U_s$ and the construction of the end resistor pair RV1 and RV2 shown in FIG. 2) is shunted by a diode D, the anode of which is connected to the respective lower-numbered terminal of the respective resistor (i.e. of the resistor 1 and the resistor 3), while the cathode thereof is connected to the respective higher-numbered terminal of the resistor of the voltage divider ST. Each even-numbered resistor (i.e. the resistor 2 and the resistor 4) is respectively shunted by a diode D*, the anode of this shunting diode D* being connected to the higher-numbered terminal, and the cathode to the respectively lower-numbered terminal of the respective shunted resistor. In the normal case, the shunt diodes are completely identical with respect to the properties thereof, so that there is no difference, in this regard, between the diodes D and the diodes D*.

As in the heretofore-known construction according to FIG. 1, the resistor section 1 of the voltage divider connected to the ring oscillator RO has the highest resistance value of 8R in the embodiment according to the invention according to FIG. 2; the next or following resistor section 2 has the resistance value of 4R; the third resistor section 3 has a value of 2R, and the fourth resistor section 4 has a base value of R. In principle, the resistance values of the resistor sections 1 to 4 can also be staggered or graduated in a different manner or arranged in an embodiment with binary weighting in a sequence other than that shown in FIG. 2. The sense or direction of staggering or graduation of the resistance values is such that the oscillator current and, thereby, the oscillator frequency can be set to as many values as possible. In principle, also the end resistor which is at supply potential $U_s$ and corresponds to the resistor RV in the circuit according to FIG. 1 can participate in the weighting.

In the preferred embodiment of the invention according to FIG. 2, the series resistor corresponding to the series resistor RV in FIG. 1 is realized by the series connection of two resistors RV1 (connected to the terminal for the supply potential $U_s$) and RV2 (connected to the last uneven-numbered divider terminal a5 of the voltage divider ST connected to an externally addressable electrode). The junction point between the two resistors RV1 and RV2 is connected on its part via the chain of two further diodes D1 and D2 to a reference potential (the base point potential of the circuit), the anode of the first diode D1 being connected to that junction point, and the cathode of the other diodes to the terminal for the reference potential.

Figure 3:
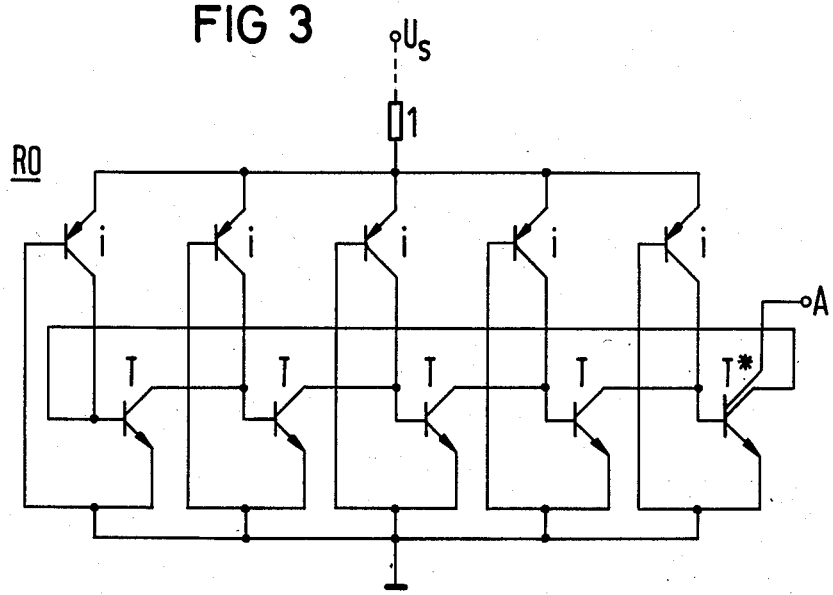
FIG. 3 is a circuit diagram of the ring oscillator shown diagrammatically in FIG. 2.

In FIG. 3, there is shown the circuit diagram of the ring oscillator RO realized in the usual manner by $I_2L$ technology. Each inverter cell of the ring oscillator RO is formed of a vertical npn transistor T (which works in upward operation) and a lateral pnp transistor which is connected as an injector i. Because, as is well known, the base of the pnp transistor i forms, with the emitter of the vertical npn transistor, a first common zone (in fact, of the n-type), and the collector of the transistor i with the base of T, a second common zone (in fact, of the p-type), and the base of the injector transistor i of the appertaining cell is at reference potential and its emitter is connected to the end terminal a1 of the voltage divider ST, the connection of the individual injector transistors i seen in FIG. 3 is readily understood. The inverter proper is realized, respectively, by the respective npn transistor T and, in the case of the last cell, by the transistor T* replacing the transistor T thereat, the base of the npn-transistors T and T*, respectively, forming the signal input, and the collector forming the signal output. To attain marked independence of the feedback leading from the signal output of the last inverter to the signal input of the last inverter of the inverter chain forming the ring oscillator RO from the part of the integrated circuit which can be acted upon by the ring oscillator output A, it is advisable to construct the npn-transistor of the last stage as a two-collector transistor, one of the collectors being connected in the feedback branch and the other thereof forming the signal output A of the oscillator RO. Regarding the dimensions of the emitter, the base and the output collector connected in the feedback path, far-reaching agreement between the transistor T* of the output cell and the transistor T of the other cells is sought after and is also achievable, as is well known. The number of inverter cells forming the ring oscillator RO is generally uneven and greater than one in the interest of ensuring the ring oscillator operation. Five inverter cells are preferred.

The trimming circuit for the ring oscillator RO, corresponding to the invention and shown in FIG. 2, functions in such a manner that, for the condition wherein all of the provided diodes D and D* are intact, the connection between the supply potential $U_s$ (=2.5 V) and the current input of the ring oscillator RO takes place only with the cooperation of the entire voltage divider ST. Via the respectively adjacent electrodes e1 and e3, on the one hand, and e3 and e5, on the other hand, either the associated shunting diode D or the shunting diode D* can be made to break through permanently if driven by the appropriate voltage. A current is thus impressed by the diodes D and D*, respectively, via the trimming pads e1, e3 and e5 which is of such value that the diode structure respectively acting as a Zener diode is destroyed and the n represents a short circuit for the respectively associated voltage divider resistor. In this manner, any desired resistors of the resistance cascade forming the voltage divider ST can be disconnected from the power supply of the ring oscillator RO (with the exception of the end resistors RV1 and RV2).

The temperature compensation determined by and resulting from the two series resistors RV1 and RV2 in connection with the two diodes D1 and D2 as well as a supply voltage $U_s$ of 2.5 V keeps the frequency drift versus or as a function of the temperature to a negligible minimum. The frequency at the output A of the ring oscillator RO, especially if it is realized in an $I^2L$ circuit) has a temperature dependency which, as practice and calculation show, in conjunction with the further elements to be driven by the ring oscillator RO (serving, for example, as a clock generator) is compensated in the integrated circuit using the type of circuit shown in FIG. 2.

Due to the shunt current via the two diodes D1 and D2, the dependence of the oscillator frequency on the supply voltage $U_s$ (preferably 2.5 V in the realization shown in FIGS. 2 and 3) is reduced, moreover. If the shunt current through the two diodes D1 and D2 varies by the factor k, the current in the ring oscillator RO and thereby the frequency thus furnished thereby varies by the factor ln k.

The frequency of the ring oscillator RO is sufficiently temperature-compensated only if the supply voltage $U_s$, the series resistors RV1 and RV2 and the number of diodes are matched to one another. If the supply voltage $U_s$ is appreciably greater than 2.5 V, the value of the resistor connected to $U_s$ and the number of diodes (which correspond to the diodes D1 and D2) are increased accordingly. This applies, in particular, if the ring oscillator RO is to be realized by another technology, for example, by TTL or ECL technology.

With respect to the preferred embodiment of the invention shown in FIG. 2, it should further be noted that the weighting of the resistance values used there, in the part of the resistor chain 1 to 4 which is connectible-up, results in the advantage that the desired accuracy for the supply current of the ring oscillator RO is attainable with a minimum of cost.

The foregoing is a description corresponding in substance to German application P 34 01 610.4, filed Jan. 18, 1984, the International priority of which is being claimed for the instant application and which is hereby made part of this application. Any material discrepancies between the foregoing specification and the aforementioned corresponding German application are to be resolved in favor of the latter.

I claim:

1. Integrated semiconductor circuit with a ring oscillator having a frequency adjustable via an operating current of the ring oscillator, the ring oscillator having inverter cells which are connected in parallel with respect to the current supply of the ring oscillator, cojointly with a current supply terminal thereof, via a variable resistance to a supply potential present in the current supply, comprising a voltage divider forming the variable resistance and including a plurality of series-connected resistors, said voltage divider having a plurality of terminals including an end terminal and a first and a second series of terminals which are connected alternatingly to one another said first series of alternating terminals beginning with a terminal immediately following said end terminal, and said second series of alternating terminals beginning with a terminal immediately following said terminal which immediately follows said end terminal, said end terminal connecting said voltage divider to a current supply terminal of the inverter cells of the ring oscillator and, additionally, to an externally addressable electrode, each terminal of said first series of alternating terminals of said voltage divider being likewise connected to another externally addressable electrode, respectively, of the integrated circuit and additionally connected via a respective diode to both terminals of said second series of alternating terminals located respectively adjacent thereto, said connecting diodes having respective anodes connected to respective terminals of said second series of alternating terminals, and having respective cathodes connected to a respective one of the two terminals of said first series of alternating terminals located adjacent thereto.

2. Integrated semiconductor circuit according to claim 1, wherein the last terminal of said first series of alternating terminals ahead of the supply potential is not connected to any of said cathodes.

3. Integrated semiconductor circuit according to claim 1, wherein said supply potential is 2.5 V.

4. Integrated semiconductor circuit according to claim 1, wherein the last terminal of said voltage divider, as counted from the ring oscillator, and connected to an electrode which is externally addressable but not connected to the supply potential, is connected via an end resistance formed by two series-connected fixed resistors to a supply terminal delivering the supply potential, said two series-connected fixed resistors having a divider point therebetween which is connected via a diode chain to a terminal for a reference potential, the diodes of said diode chain having respective anodes facing towards said divider point.

5. Integrated semiconductor circuit according to claim 4, wherein said resistors of said voltage divider are addressable between the ring oscillator and the last electrode of the integrated circuit which is externally addressable but not connected to the supply potential, said resistors being weighted binarily with respect to the resistance values thereof.

6. Integrable semiconductor circuit according to claim 1, wherein the ring oscillator is constructed in accordance with I$^2$L technology.

7. Integrated semiconductor circuit according to claim 6, wherein the rest of the integrated circuit is likewise constructed in accordance with I$^2$L technology.

* * * * *